(12) United States Patent
Vogt

(10) Patent No.: US 12,265,287 B2
(45) Date of Patent: Apr. 1, 2025

(54) DEVICE FOR MODULATING A PHYSICAL PROPERTY OF A LIGHT BEAM IN RESPONSE TO AN ELECTRICAL SIGNAL

(71) Applicant: QUBIG GMBH, Munich (DE)

(72) Inventor: Enrico Vogt, Munich (DE)

(73) Assignee: Qubig GmbH, Munich (DE)

( * ) Notice: Subject to any disclaimer, the term of this patent is extended or adjusted under 35 U.S.C. 154(b) by 527 days.

(21) Appl. No.: 17/596,318

(22) PCT Filed: Jun. 17, 2020

(86) PCT No.: PCT/EP2020/066823
§ 371 (c)(1),
(2) Date: Dec. 7, 2021

(87) PCT Pub. No.: WO2020/254442
PCT Pub. Date: Dec. 24, 2020

(65) Prior Publication Data
US 2022/0221745 A1   Jul. 14, 2022

(30) Foreign Application Priority Data
Jun. 18, 2019 (EP) .................... 19180946

(51) Int. Cl.
*G02F 1/03* (2006.01)
*H05K 1/02* (2006.01)
(52) U.S. Cl.
CPC ......... *G02F 1/0327* (2013.01); *H05K 1/0274* (2013.01)
(58) Field of Classification Search
CPC ............ G02F 1/0327; H05K 1/0274

USPC ........................................................ 359/237
See application file for complete search history.

(56) References Cited

U.S. PATENT DOCUMENTS

| 5,189,547 A | 2/1993 | Day et al. |
|---|---|---|
| 2006/0092494 A1 | 5/2006 | Tinoco |
| 2011/0133063 A1 | 6/2011 | Ji et al. |
| 2012/0051683 A1 | 3/2012 | Sugiyama |
| 2013/0004167 A1 | 1/2013 | Kim |
| 2017/0108757 A1 | 4/2017 | Ishii et al. |
| 2017/0269215 A1 | 9/2017 | Hall et al. |
| 2018/0024411 A1 | 1/2018 | Miyazaki et al. |
| 2018/0088361 A1 | 3/2018 | Sugamata et al. |
| 2018/0231866 A1 | 8/2018 | Sugamata et al. |

FOREIGN PATENT DOCUMENTS

| CN | 102141650 A | 8/2011 |
|---|---|---|
| CN | 103874944 A | 6/2014 |
| CN | 109154661 A | 1/2019 |
| EP | 0 977 074 B1 | 9/2008 |
| EP | 2 884 331 A1 | 6/2015 |

OTHER PUBLICATIONS

International Search Report of PCT/EP2020/066823, Sep. 3, 2020, 2 pages.

*Primary Examiner* — William Choi
(74) *Attorney, Agent, or Firm* — Womble Bond Dickinson (US) LLP

(57) ABSTRACT

A device (1) for modulating a physical property of a light beam in response to an electrical signal is provided, comprising at least one light modulating element (13) capable of modulating a physical property of a light beam in response to an electrical signal and an enclosure (10) enclosing the at least one light modulating element (13). The enclosure (10) is configured to be integrated on a printed circuit board (40, 100).

20 Claims, 5 Drawing Sheets

DEVICE FOR MODULATING A PHYSICAL PROPERTY OF A LIGHT BEAM IN RESPONSE TO AN ELECTRICAL SIGNAL

CROSS-REFERENCE TO RELATED APPLICATION(S)

This application is a U.S. National Phase Patent Application of International Application Number PCT/EP2020/066823, filed on Jun. 17, 2020, which claims priority to European Patent Application Number 19180946.6, filed Jun. 18, 2019. The entire content of each of which is incorporated herein by reference.

The present invention is related to a device for modulating a physical property of a light beam in response to an electrical signal and especially to a device that is integrated or configured to be integrated with other electronic, optoelectronic and optical components on a printed circuit board. The invention is also related to a method for manufacturing such a device.

Presently, lasers are used in a large number of different application fields ranging from high-power applications such as material processing and welding to measuring technology and medical treatment as well as high-frequency applications in the field of optical communication technology. In the future, a still further growing range of applications for laser beams are expected.

A future application is, for example, in the field of quantum technology (QT) which is an upcoming technology for which research and development is carried out all over the world. This includes, for example, experiments for very promising daily-life applications in the field of computing, cryptography, sensors, telecommunication, holography, and so on.

For many application of lasers, not only in quantum technology, it is required that physical properties of a light beam, respectively the laser beam, are prepared in a special manner. Not only the intensity of the laser beam has to be controlled as in most present applications, but also other parameters such as phase, polarization, position, direction, frequency, noise, etc. have to be adjusted very precisely. For this preparation of the laser beam, various electronical, mechanical and optical components are required, among others electro-optic modulators.

For the time being, the experimental setups for the new technology require a large space. FIG. 8 shows an example for a conventional setup of such a system. In a shelf 900, space consuming electronic devices such as a laser driver 901, RF equipment 902 etc. are accommodated. Optical and optoelectronic devices, for example a laser 903, an electro-optic modulator 904, a detector 905 and various components such as isolators, lenses, mirrors etc. (not shown in the figure) are arranged on an optical bank 906 and precisely adjusted in relation to each other. The laser beam 907 propagates through free space from the laser 903 via various components to the detector 905.

The system is accommodated in a sheltered ambiance, for example in a temperature, humidity and cleanliness controlled laboratory. By such setups, new functions can be realized, but the complexity of the setup prevents a transition into an industrial exploitation of these functions.

In order to put the new technologies into practice for everyday life applications, it is required that all the components of an equipment (including electronics, optics, mechanics, and so on) must become more robust, much smaller, less sensitive to dirt, ambient changes (temperature, pressure, etc.), and, especially, integrable with each other.

In the past, miniaturization of electronic circuits and their integration on printed circuit boards has already reached a high level. In the meantime, solutions are known in which also some parts of a complex laser setup are miniaturized and can be integrated with electronic circuits. Those components of a laser system may, for example, comprise the laser itself, merely optical devices such as mirrors, lenses, etc., and optoelectronic components such as a photodetector. However, in order to manipulate, stabilize, control, or adjust (which in the following generally are summarized in the term "modulate") the properties of a laser beam in a desired way, it is still required to build up large equipment which prevents such systems from being put in an everyday practice.

A key component for the systems is a device for modulating the physical properties of a light beam. A specific example of such a device is an electro-optic modulator. The electro-optic modulator changes the properties of the light in response to an electrical signal which is applied to a piece of material exhibiting an electro-optic effect.

U.S. Pat. No. 5,189,547 describes an electro-optic modulator comprising an electro-optic crystal and a resonant circuit mounted on a substrate and included in a package. Since the electro-optic effect is very small, large voltages generally have to be applied to the crystal to achieve a desired effect. Hence, by using such a modulator in a laser application, a space consuming experimental setup would be required. In U.S. Pat. No. 5,189,547, the voltage applied to the crystal is increased by the resonant circuit.

In order to reduce the voltage required for driving an electro-optic modulator, attempts have been made to reduce the size of the electro-optic component in order to increase the electrical field generated within by the applied voltage. EP 2 884 331 A1, for example, describes an electro-optic modulator structure integrated on a silicon-on-insulator (SOI) substrate. The electro-optic component is formed by an optical waveguide made of an electro-optical polymer integrated on the substrate. Electro-optic modulators comprising an optical waveguide integrated on a substrate are commercially available. The waveguides generally have a thickness of about 50 µm. However, waveguides having such a small cross-section can only be used for limited wavelength ranges and light beams with a small power. Further, the aperture of the waveguides is small so that free-space coupling of a light beam hardly is possible. Therefore, the light has to be coupled into the waveguide by optical fibers. The fibers themselves have to be precisely aligned with regard to the waveguides.

The prior art known up to now is not suitable for providing an entirely miniaturized integrated electro-optical system as a whole. Electro-optic modulators comprising an electro-optic crystal as in U.S. Pat. No. 5,189,547 typically have a size of some centimeters. Further, even if the electro-optic component itself is small in an electro-optic modulator comprising an optical waveguide structure as in EP 2 884 331 A1, the entire modulator also has a size of some centimeters because the thin and sensitive electro-optic component has to be mounted on a carrier and also optical fibers have to be fixed to and aligned with the electro-optic component. Both types of electro-optic modulators are therefore not able to be integrated into a miniaturized electro-optical system.

It is therefore an object of the present invention to provide an electro-optic modulator that is small in size and can easily be integrated with different electronic, optoelectronic and optical components.

The foregoing and other objects are achieved by the subject matters of the independent claims, respectively. Further implementation forms are indicated in the dependent claims. Therein, the method claims may also further be restricted by the features of the dependent product claims and vice versa.

A device according to the invention for modulating a physical property of a light beam in response to an electrical signal comprises at least one light modulating element capable of modulating the physical property of the light beam in response to an electrical signal and an enclosure enclosing the at least one light modulating element. The enclosure is configured to be integrated on a printed circuit board.

With such a device, it is for example possible to unite the functionality of modulating a physical property of a light beam with other electronic, opto-electronic and optical components on a single printed circuit board, thus integrating optics and electronics. By means of this, it is for example possible to integrate a complete laser system comprising a laser source and various optical and/or opto-electronical components including their entire driver electronics together with the device for modulating a physical property of a light beam as a means for preparing properties of the laser beam in a desired way on a single printed circuit board, thereby reducing the size of such a setup possibly by more than a factor of 1000 compared to the size of current systems.

The term "modulating a physical property of a light beam" in this context means any changing of a property of a light beam including manipulating, stabilizing, controlling, or adjusting the property. The property is, for example, an intensity, phase, polarization, position, direction, frequency, noise or any other property of the light beam.

The term "integrated on a printed circuit board" in this context means that the enclosure is configured to be fixedly attached to the printed circuit board, for example by gluing, bonding and/or soldering. This also implies that the casing has a suitable size for the integration on a printed circuit board, i.e. a size that is comparable with other components on the printed circuit board.

The enclosure may be a casing, for example a standard through-hole or surface-mount package used in electronics. Thereby, it is for example possible to easily handle the device as any other electronic component. By fixedly attaching the casing to the printed circuit board, the components accommodated in the casing are at the same time electrically connected to the printed circuit board. If the casing is a metal casing, it also effects a shielding of its interior towards the outside, thus enhancing the electromagnetic compatibility.

The device may further comprise an insulating substrate, preferably made from a ceramic material, wherein the at least one light modulating element is attached to the insulating substrate and the insulating substrate together with the at least one light modulating element, is accommodated within the casing. Thereby, it is for example possible to easily arrange the components of the device, for example the light modulating element and possibly other circuits and components formed or mounted on the substrate within the casing.

As an alternative, the at least one light modulating element may be mounted directly on the printed circuit board, and the enclosure may be mounted on the printed circuit board in a way that it encloses the at least one light modulating element. Thereby, it is for example possible to directly integrate the device for modulating a physical property of a light beam on the printed circuit board instead of providing it as a separate component that may be integrated on the printed circuit board. If the enclosure is a metal enclosure, it also effects a shielding of its interior towards the outside, thus enhancing the electromagnetic compatibility.

The enclosure may comprise a light inlet window configured to permit a light beam from the outside to be directed to an input surface of the light modulating element, and a light outlet window configured to permit a light beam leaving an output surface of the light modulating element to pass to the outside. Thereby, it is for example possible to process a free-space light beam in an optical path formed on the printed circuit board.

The device may further comprise a signal input for receiving the electrical signal for modulating the physical property of the light beam, wherein a input impedance of the signal input may be matched to a characteristic impedance of a signal line formed on the printed circuit board or to a characteristic impedance defined for the frequency range of the input signal, preferably 50Ω, 75Ω or 600Ω. Thereby, it is for example possible to avoid a reflection of the input signal at the signal input, thus enhancing the electromagnetic compatibility. In the state of the art, specific characteristic impedances of circuits and transmission lines are commonly defined for specific signal frequency ranges. For signals in the audio frequency range, for example, a standard characteristic impedance of 600Ω is defined. For high frequencies, characteristic impedances of 50Ω or 75Ω are defined.

The device may further comprise a resonant element having a resonance frequency and being configured to supply a signal having an amplitude greater than an amplitude of the electrical signal for modulating the physical property of the light beam at the resonance frequency to the light modulating element. Thereby, it is for example possible to reduce the voltage required for achieving a desired modulation of the light beam.

The resonant element may be enclosed by the enclosure and/or it may act as an impedance matching element for matching the input impedance of the signal input to a characteristic impedance of a signal line formed on the printed circuit board or to a characteristic impedance defined for the frequency range of the electric signal. Thereby, it is for example possible to shield electromagnetic radiation emitted from the resonant element by the enclosure and/or to avoid a reflection of the electrical signal at the signal input, thus enhancing the electromagnetic compatibility.

The resonant element may be mounted on a wiring pattern formed on the printed circuit board or on the substrate, or it may be formed by portions of the wiring pattern. Thereby, it is for example possible to easily realize a resonant element integrated on the substrate comprised in the electro-optic modulator.

The resonance frequency of the resonant element may be adjustable. Thereby, it is for example possible to adapt the electro-optic modulator to changes of the input frequency.

The device may comprise a travelling wave element configured to supply the electrical signal for modulating the physical property of the light beam to the light modulating element, wherein the travelling wave element is enclosed by the enclosure and/or the travelling wave element acts as an impedance matching element for matching the input impedance of the signal input is to a characteristic impedance of a signal line formed on the printed circuit board or to a characteristic impedance defined for the frequency range of the electric signal. Thereby, it is for example possible to shield electromagnetic radiation emitted from the travelling wave element by the enclosure and/or to avoid a reflection of the electrical signal at the signal input, thus enhancing the electromagnetic compatibility.

The device may comprise at least one electro-optic modulator, wherein the electro-optic modulator comprises a crystal made of a material exhibiting an electro-optic effect, the crystal being the light modulating element of the device. Thereby it is for example possible to provide an electro-optic modulator as a device for modulating a physical property of a light beam in response to an electrical signal that can be integrated together with a laser and/or other electronic, opto-electronic and optical components on a single printed circuit board, thus integrating optics and electronics and facilitating the creation of a micro-integrated electro-optical system with a small size.

The term "crystal" in this context means a bulk crystal in which the electro-optic material is formed as a separate single-piece free-space crystal. In contrast thereto, waveguides integrally formed on a substrate as described above are not considered as "crystals" in the sense of the present invention. The term "free-space" in this context means that the light propagates freely through the space into the crystal, and is not guided through optical guides such as optical fibers which are attached in a fixed relation to the crystal.

A printed circuit board according to the invention comprises a device for modulating a physical property of a light beam in response to an electrical signal according to the invention. Thereby, it is for example possible to provide a printed circuit board on which the electro-optic modulator is integrated together with other electronic, opto-electronic and optical components, thus integrating optics and electronics and facilitating the creation of a micro-integrated electro-optical system with a small size.

A method of producing a device for modulating a physical property of a light beam in response to an electrical signal according to the invention comprises providing at least one light modulating element capable of modulating the physical property of the light beam in response to an electrical signal and enclosing the at least one light modulating element with an enclosure which is configured to be integrated on a printed circuit board. With such a method, it is for example possible to manufacture a device for modulating a physical property of a light beam in response to an electrical signal that can easily be integrated together with other electronic, opto-electronic and optical components on a single printed circuit board, thus facilitating the creation of a micro-integrated electro-optical system with a small size.

The method may comprise manufacturing an electro-optic modulator by providing an insulating substrate with a wiring pattern at least on one surface of the insulating substrate, providing a crystal being made of a material exhibiting an electro-optic effect, the crystal being the light modulating element, with a set of electrodes in a way that an electric field is generated within the bulk crystal when a voltage is applied to the electrodes, attaching the bulk crystal to the insulating substrate, forming a resonant element on or by the wiring pattern, the resonant element having a resonance frequency for applying a signal having an amplitude increased over an input signal at the resonance frequency to the set of electrodes, and accommodating the substrate with the bulk crystal and the resonant element in the. With such a method, it is for example possible to manufacture an electro-optic modulator that can easily be integrated together with other electronic and optoelectronic components on a printed circuit board, thus facilitating the creation of an integrated system with a small size.

A method of producing a printed circuit board according to the invention comprises providing a printed circuit board, providing a device for modulating the physical property of the light beam in response to an electrical signal according to the invention, and integrating the device for modulating a physical property of a light beam on the printed circuit board. Further electronic, optoeletronic and/or optical components may be integrated on the printed circuit board, too. With such a method, it is for example possible to manufacture a printed circuit board on which the device for modulating the physical property of the light beam is integrated together with other electronic, opto-electronic and optical components, thus facilitating the creation of a micro-integrated electro-optical system with a small size.

A method of operating a device for modulating a physical property of a light beam in response to an electrical signal according to the invention comprises directing a light beam from the outside to an input surface of the light modulating element, and supplying an input signal to the signal input. Thereby, it is possible, for example, to operate a device for modulating a physical property of a light beam in response to an electrical signal which is integrated together with other electronic, opto-electronic and optical components, thus facilitating the creation of a micro-integrated electro-optical system with a small size.

A use of a device for modulating a physical property of a light beam in response to an electrical signal according to the invention comprises performing a modulation of a light beam. Thereby, it is possible, for example, to modulate a light beam by means of an electro-optic modulator which is integrated together with other electronic, opto-electronic and optical components, thus facilitating the creation of a micro-integrated electro-optical system with a small size.

A method for performing a modulation of a light beam, comprises directing a light beam from the outside to an input surface of a light modulating element of a device for modulating a physical property of a light beam in response to an electrical signal according to the invention, and supplying an input signal to the signal input of the device. Thereby, it is possible, for example, to modulate a light beam by means of an electro-optic modulator which is integrated together with other electronic, opto-electronic and optical components, thus facilitating the creation of a micro-integrated electro-optical system with a small size.

Further features and useful aspects of the invention can be found in the description of exemplary embodiments with reference to the attached drawings.

FIG. 2 shows schematic views of an electro-optic modulator according to an embodiment of the present invention, wherein.

FIG. 7 shows schematic views of an electro-optic modulator according to another embodiment of the present invention, wherein.

In the following, an embodiment of the invention is described with reference to FIGS. 1 through 6.

Figure 1:
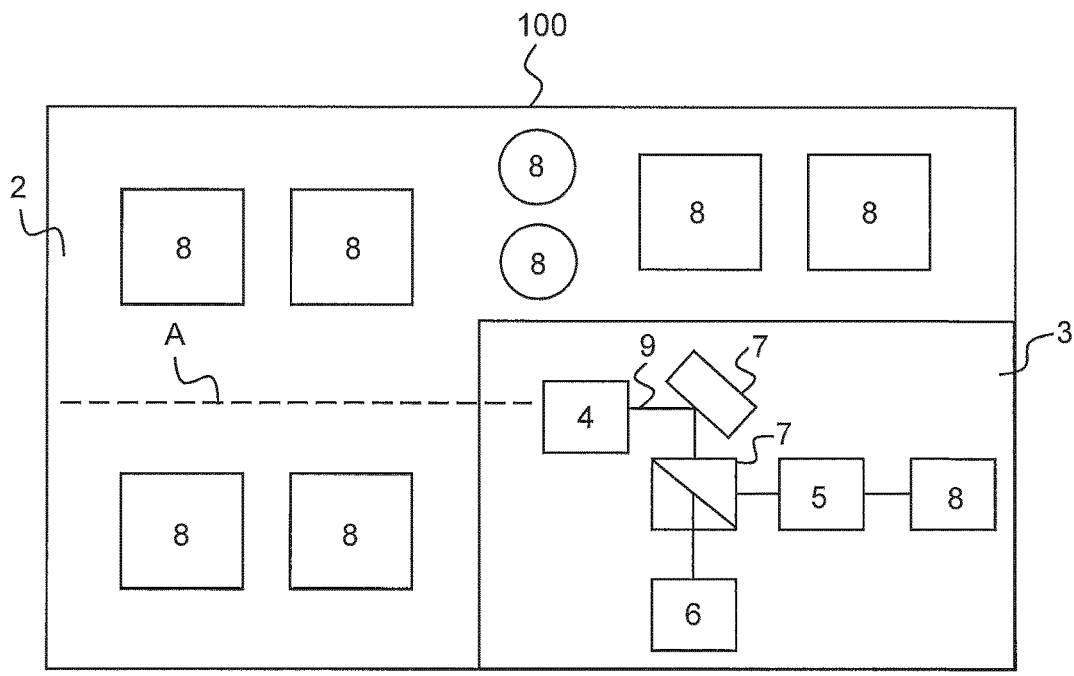
FIG. 1 shows a schematic view of a printed circuit board according to the present invention.

FIG. 1 shows a schematic view of a printed circuit board 100 on which a laser system is integrated. The printed circuit board has an electronics region 2 and an optics region 3. In the optics region 3, a laser 4, an electro-optic modulator 5, photodetectors 6 as well as optical elements 7 such as a beam splitter and a mirror are mounted. In the electronics region 2, electronical components 8 such as driver for the opto-electronical components, signal processing circuits or microcontrollers are mounted. A laser beam 9 propagating through free space is directed by the optical components, for example through the beam splitter to a photodetector 6 or through the electro-optic modulator 5 to another photodetector 6. The electro-optic modulator 5 acts as a device for modulating a physical property of the light beam as a means for preparing properties of the laser beam in a desired way. All the components 4, 5, 6, 7, 8 are integrated on the single printed circuit board 100.

As an alternative, the laser may be omitted from the printed circuit board, and an external laser beam may be directed along an optical axis A shown by a dashed line to the optical and opto-electronic components integrated on the printed circuit board 100.

Figure 2A:
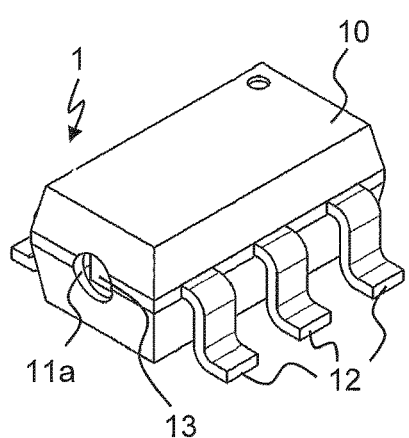
FIG. 2a shows a schematic perspective view.
Figure 2B:
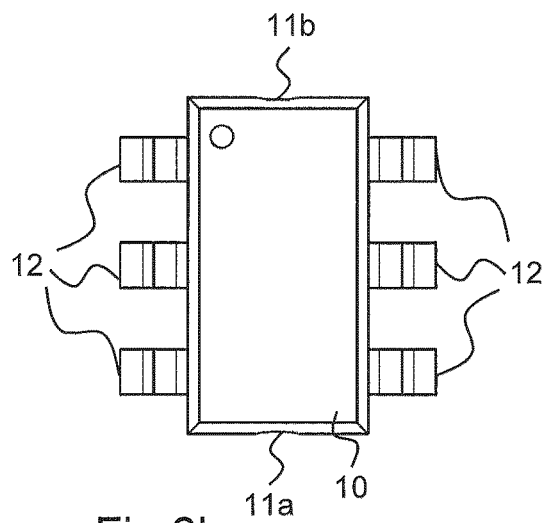
FIG. 2b shows a schematic top view.
Figure 2C:
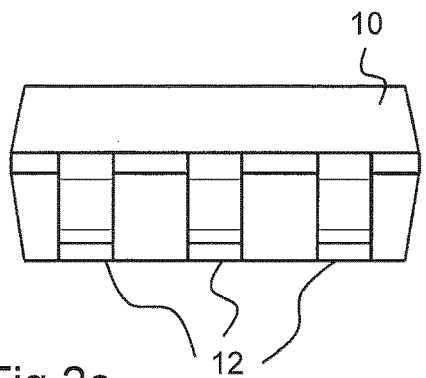
FIG. 2c shows a schematic side view.
Figure 2D:
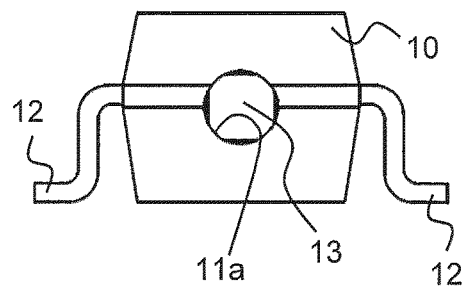
FIG. 2d shows a schematic front view.

FIGS. 2a to 2d show schematic views of a device for modulating a physical property of a light beam in response to an electrical signal in form of an electro-optic modulator according to an embodiment of the present invention. Therein, FIG. 2a shows a schematic perspective view, FIG. 2b a schematic top view, FIG. 2c a schematic side view and FIG. 2c a schematic front view.

The electro-optic modulator 1 comprises a casing 10 having a first opening 11a formed at its front side and a second opening 11b formed at its rear side. The casing further has leads (pins) 12 for an electrical connection to the outside. At least one of the leads 12 serves as a signal input for receiving an input signal.

Within the casing 10, a light modulating element in the form of a crystal 13 is arranged in a way that a light beam passing through the first opening 11a (light inlet window) of the casing 10 incides on the front face of the crystal 13, passes through the crystal 13 and leaves the casing 10 through the second opening 11b (light outlet window) at the opposite side of the casing 10. The crystal 13 is made of a material exhibiting an electro-optic effect. It may be any material usually used for electro-optic modulators, exhibiting the linear electro-optic effect (also called Pockels effect), the quadratic electro-optic effect (also called Kerr effect), or any higher order electro-optic effect. Examples of such materials include among others ammonium dihydrogen phosphate (ADP), potassium dihydrogen phosphate (KDP), deuterated potassium dihydrogen phosphate (DKDP or KD*P), potassium tantalum niobium oxide (KTN), lithium niobate (LN), lithium tantalate (LT) and others. For infrared applications, gallium arsenide (GaAs) is especially suited.

The crystal is formed as a bulk crystal and preferably has the form of a cuboid. The cross section is selected to provide a sufficiently large aperture for the light beam used. It may for example have a size in the range from 0.5 mm×0.5 mm to 20 mm×20 mm which is well suited for an open-space laser beam having a beam width of 0.5 to 1 mm which can be expected in on-board electro-optical systems. The length of the crystal depends on the required modulation magnitude. It typically may be in the range from 5 to 30 mm.

In the present embodiment, the crystal 13 and further elements are accommodated within the casing 10. In the following, exemplary examples are described how that can be accomplished without the present invention being restricted to these examples.

Figure 3:
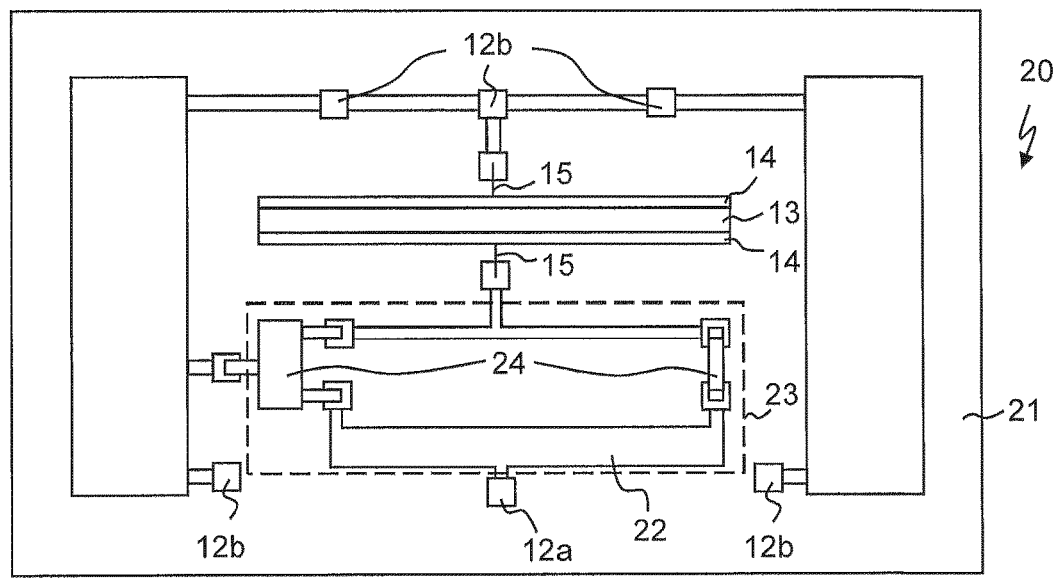
FIG. 3 shows a schematic plan view of a substrate comprised in the electro-optic modulator shown in FIG. 2.

FIG. 3 shows a schematic plan view of a substrate 20 comprised in the electro-optic modulator 1. The substrate 20 is an insulating substrate, made for example of ceramics material.

On the front surface 21 of the substrate 20, a wiring pattern 22 is arranged. The wiring pattern 22 may for example be formed by transmission lines, connection pads for connecting electronic components, and ground patterns. Some of the connection pads may serve for connecting the leads 12. On the back surface of the substrate 20 which is not shown in the figure, another wiring pattern may be formed, or the entire back surface may be covered with a ground plane.

The electro-optic crystal 13 is mounted on the substrate 20. A set of electrodes 14 is provided on the crystal 13 in a way to generate an electric field within the crystal 13 when a voltage is applied to the electrodes. The electrodes are connected to connection pads of the wiring pattern 22 by bond wires 15.

Further accommodated within the casing 10 is a resonant element having a resonance frequency for applying a signal having an amplitude increased over the input signal at the resonance frequency to the set of electrodes 14 of the crystal 13. In the present example, the resonant element is formed by a discrete LRC network mounted on the wiring pattern of the substrate. The LRC network is schematically indicated in the figure by electronic components 24 mounted to the wiring pattern 22, for example by soldering. The electronic components 24 may also comprise adjustable elements such as adjustable inductors or capacitors so that the resonance frequency of the LRC network may be changed.

Figure 4:
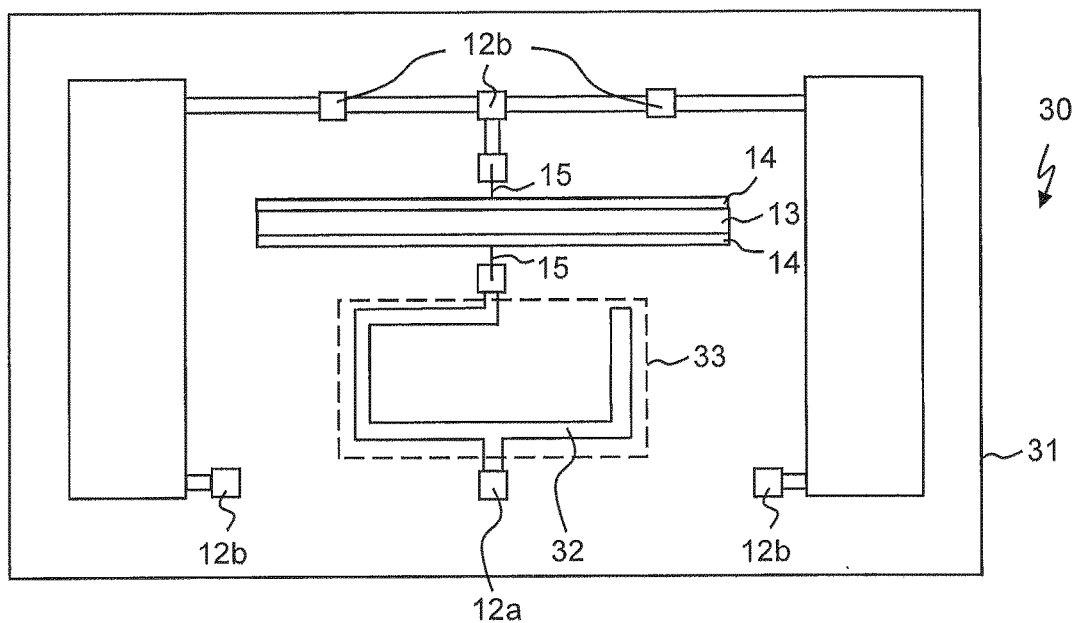
FIG. 4 shows a schematic plan view of a modification of the substrate comprised in the electro-optic modulator shown in FIG. 2.

Another example is shown in FIG. 4. It differs from the example shown in FIG. 3 in the form of the resonant element, only. Therefore, only the differences in the resonant element are described below.

In the present example, the resonant element 33 is integrated on the substrate 30 and formed by portions of the wiring pattern 32 formed on the front surface 31 of the substrate 30. These portions of the wiring pattern 32 forming the resonant element 33 may, for example, comprise transmission lines, shorted stubs or open stubs having a specific length with regard to an electrical wavelength of a signal having the intended resonance frequency.

As an alternative to the resonant elements described above, a split ring or a cavity may be used to extend the frequency range to higher resonance frequencies.

The entire electro-optical modulator is dimensioned such that it can easily be mounted on a printed circuit board. The casing 10 shown in FIG. 2 is a custom specific surface-mount package. A standard package, for example of of SOT23-6 type (SOT 23 with 6 leads), may be used instead. The casing may, however, be any type of through-hole or surface-mount package used in electronics, such as TO-18, TO-263, DIL, LGA, PGA, etc. or any other type of package which is adapted to be mounted on a printed circuit board. It may, for example, be a metal casing or a plastic casing. The use of a metal casing has an advantage in that electromagnetic radiation generated within the package is efficiently shielded.

Figure 5:
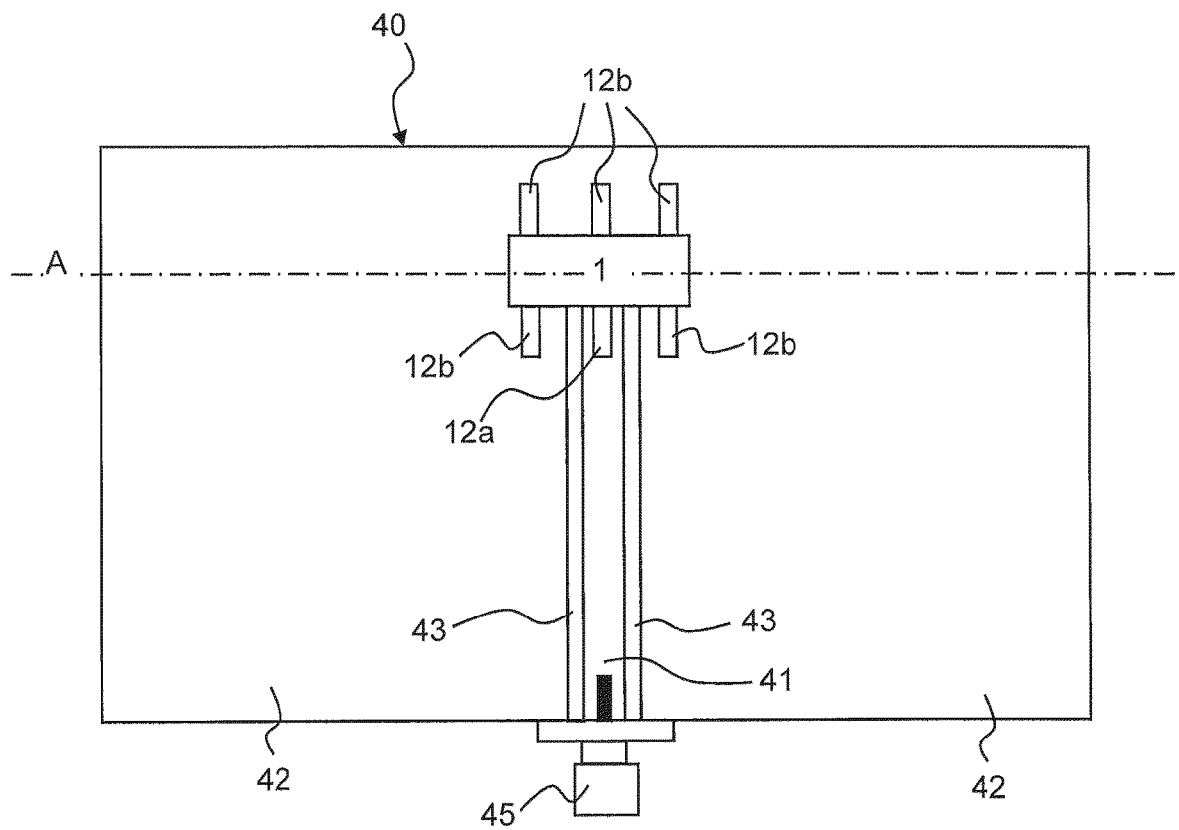
FIG. 5 shows an exemplary arrangement of the electro-optic modulator shown in FIG. 2 on a printed circuit board.

FIG. 5 shows a top view of an exemplary arrangement of the electro-optic modulator 1 on a printed circuit board.

On the front surface of the printed circuit board 40, a planar transmission line 41 is formed. The rest of the front surface not covered by the transmission line 41 is covered by a ground pattern 42, wherein a gap 43 is left between the transmission line 41 and the ground pattern 42.

The electro-optic modulator 1 is mounted on the printed circuit board 40, for example by soldering its leads 12 to the transmission line 41 and the ground pattern 42, respectively. In the present example, a single lead 12a is connected to the transmission line 41 and serves as the signal input, while the remaining leads 12b are connected to the ground pattern 42. Preferably, the electro-optic modulator 1 is mounted on the printed circuit board 40 in a way that an optical axis A passing through the two openings 11 of the casing 10 and the crystal 13 is not obstructed by other elements mounted on the printed circuit board 40.

An input impedance of the signal input 12a is matched to the characteristic impedance of the transmission line 41, or generally to a characteristic impedance defined for the frequency range of the input signal. In the state of the art, specific characteristic impedances of circuits and transmission lines are commonly defined for specific signal frequency ranges. For signals in the audio frequency range, for example, a standard characteristic impedance of 600Ω is defined. For high frequencies, characteristic impedances of 50Ω or 75Ω are defined. Depending on an internal structure of the electro-optic modulator 1, impedance matching of the signal input 12a may be performed in different ways.

For example, if the resonant element is realized by a discrete LRC network as described above with reference to FIG. 3 or by portions of the wiring pattern as described above with reference to FIG. 4, design methods are known to adjust frequency and input impedance to the desired values. Further, if the input impedance differs from the desired value, design methods are known to transform the input impedance to the desired value by portions of the wiring pattern. Due to the resonant operation of the electro-optic modulator in a small frequency range around the resonance frequency, such an impedance matching needs only be provided in that small frequency range. The use of a resonant element for the impedance matching has the advantage of a very efficient signal enhancement, while the bandwidth is limited.

Figure 6:
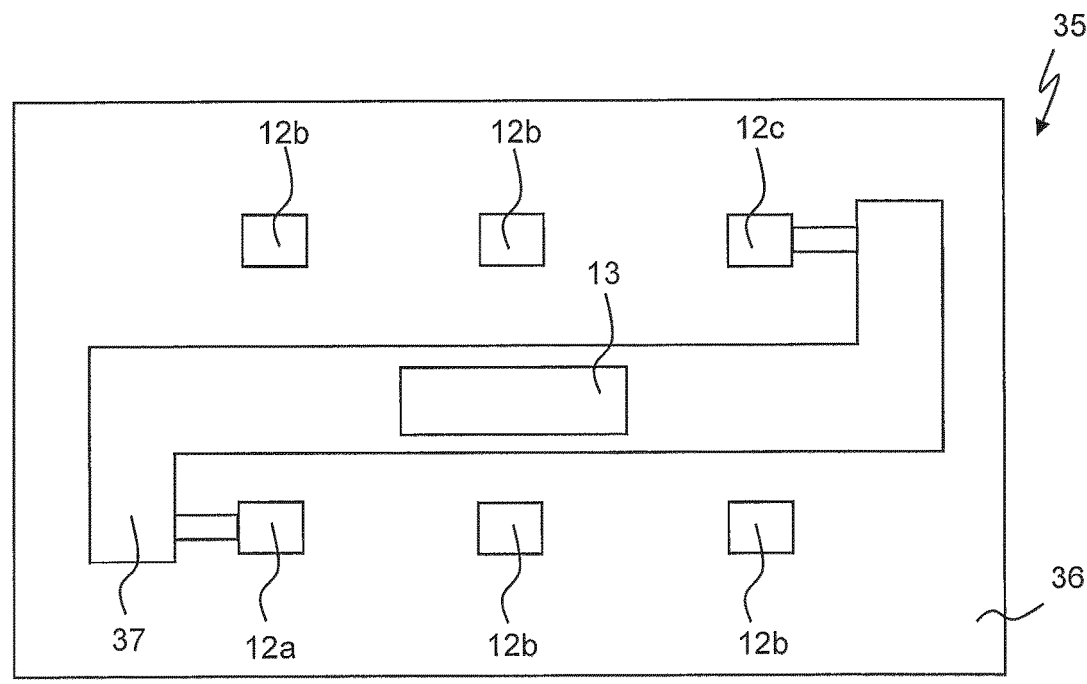
FIG. 6 shows a schematic plan view of another modification of the substrate comprised in the electro-optic modulator shown in FIG. 2.

As an alternative for matching the impedance of the signal input 12a, a travelling wave approach may be used. FIG. 6 shows a schematic plan view of another substrate 35 that might be comprised in the electro-optic modulator 1. On the front surface 36 of the substrate 35, a transmission line 37 is formed between a signal input 12a and a signal output 12c. The electro-optic crystal 13 is bonded to the transmission line 37 so that the transmission line 37 extends into the length direction of the crystal. The input signal then propagates on the transmission line 37 in phase with the light beam propagating through the electro-optic crystal 13. The impedance at the input on the transmission line 37, i.e. at the signal input 12a, can be adjusted by a load connected to the end of the transmission line 37, for example to the signal output 12c. This alternative approach of realizing an impedance matching element achieves a matching of the input impedance over a broad frequency range, but does not provide the resonant enhancement of the input signal.

At the border of this printed circuit board 40, a connector 45 also is connected to the transmission line 41 and the ground pattern 42. The connector 45 serves for supplying a modulation signal to the electro-optic modulator 1. Any type of connector may be used that is suited for the corresponding signal frequencies. Preferably, the connector is the coaxial connector such as the BNC connector or an SMA connector.

The printed circuit board may be a double-sided Eurocard as defined in IEC-60297-3 or the related IEEE standards or any other form of printed circuit board having wiring layers on one or both sides or a multilayer printed circuit board. It may be designed for a through-hole technology and/or a surface-mount technology.

In operation, a light beam, for example a laser beam, is supplied along the optical axis A of the electro-optic modulator 1. A modulation signal is supplied via the connector 45 and the transmission line 41 to the signal input lead 12a of the electro-optic modulator 1. Within the electro-optic modulator 1, the signal is amplified by the resonant element and applied to the electrodes of the crystal 13. Depending on the amplified modulation signal, the refractive index of the crystal 13 changes, and the light beam is modulated correspondingly.

The printed circuit board 40 shown in the figure only is an example. Other electronic, opto-electronic and optical components such as a signal generator, a laser driver and a laser as well as mirrors, prisms and/or lenses may be integrated on the printed circuit board, too. Therein, an optical axis of the laser and the optical receiver are aligned with the optical axis A of the electro-optic modulator 1 so that a free-space propagation of a laser beam from the laser to the crystal 13 and of the modulated laser beam from the crystal 13 to the optical receiver is achieved. In this way, it is easily possible to integrate the electro-optic modulator 1 with other components of an electro-optic system on the same printed circuit board. By its optical windows, the electro electro-optic modulator is well adapted to the free-space propagation of laser light which is best suited for such on-board electro-optical systems. For many applications, this offers a space saving and easy-to manufacture solution.

Figure 7A:
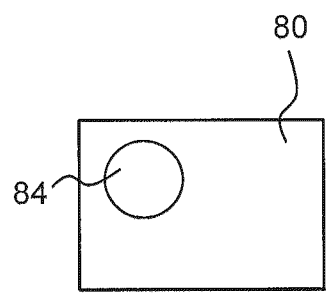
FIG. 7a shows a schematic top view.
Figure 7B:
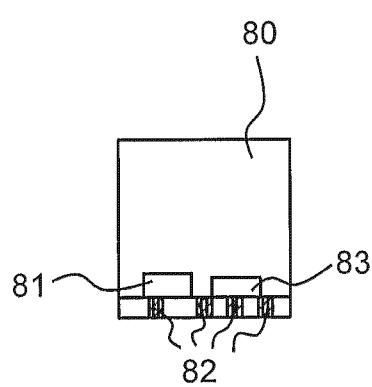
FIG. 7b shows a schematic front view.
Figure 7C:
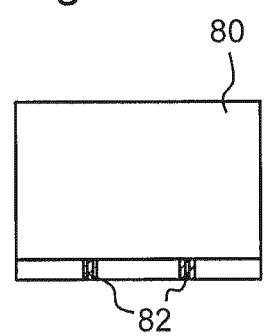
FIG. 7c shows a schematic side view.
Figure 7D:
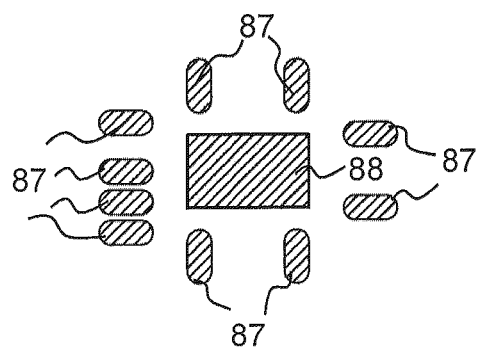
FIG. 7d shows a schematic land pattern.
Figure 7E:
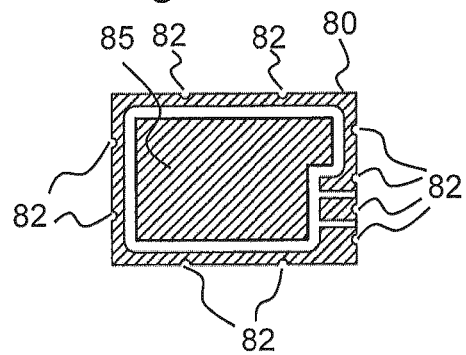
FIG. 7e shows a schematic bottom view.
Figure 8:
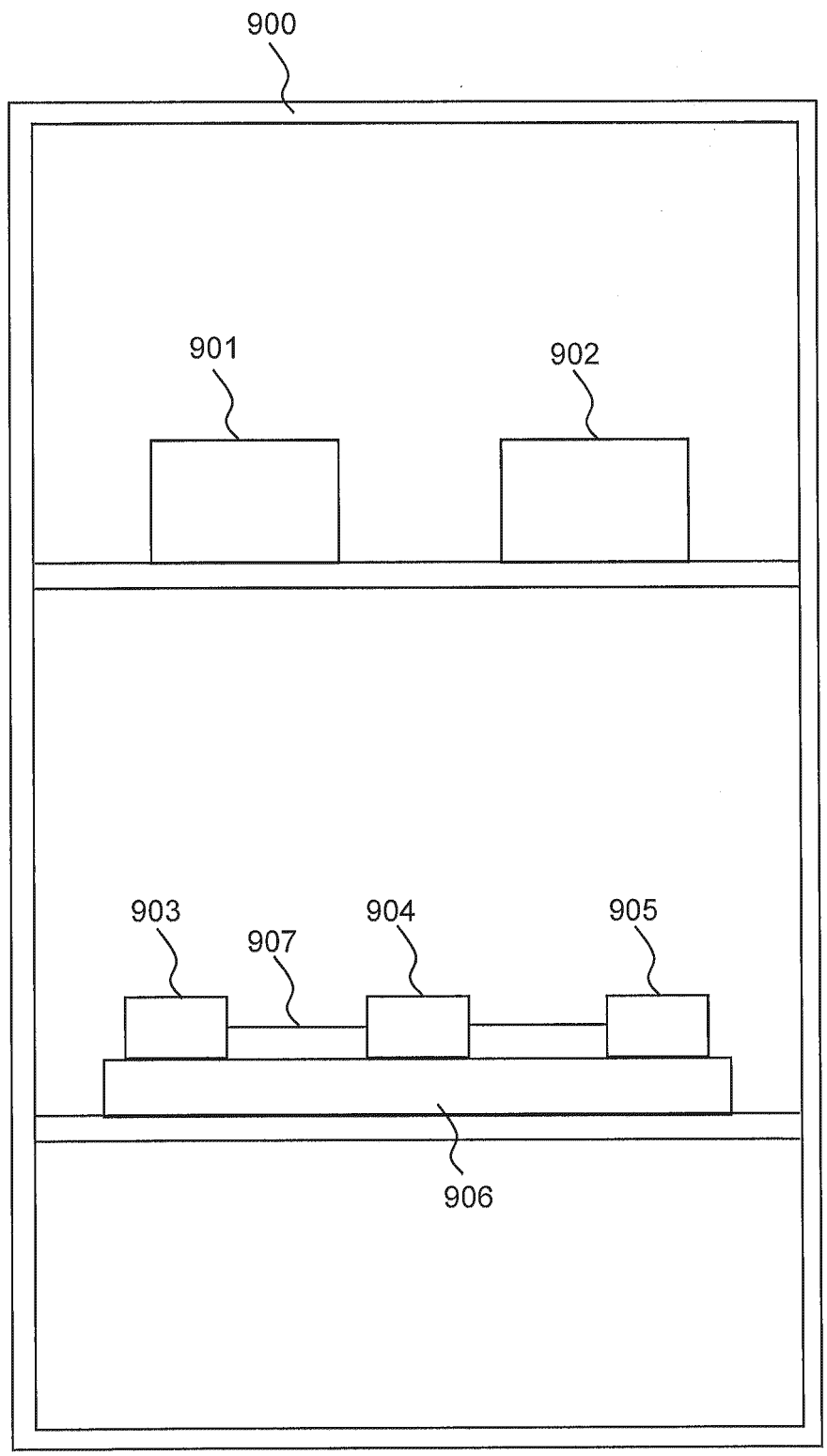
FIG. 8 shows a conventional laser system.

FIG. 7 shows schematic views of an electro-optic modulator according to another embodiment of the present invention, wherein, FIG. 7a shows a schematic top view, FIG. 7b shows a schematic front view, FIG. 7c shows a schematic side view, and FIG. 7e shows a schematic bottom view.

In this example, the casing 80 is not a standard package for electronic components, but a customer specific casing. It preferably is made of metal. As the casing 10 shown in FIG. 2, the casing 80 has an opening 81 formed at its front side to let a light beam incide upon the electro-optic crystal (and another opening formed at its rear side not shown in the figure to let the light beam leave the casing).

The casing further has connecting elements 82 for connecting the casing 80 to a printed circuit board. The connecting elements 82 are formed as recesses in the metal casing which are suited to accommodate solder for mounting the casing on a printed circuit board. One of the connecting elements 82 is electrically insulated from the metal casing (in the specific example by an opening 83 in the casing 80). At the top of the casing 80, an (optional) opening 84 is provided for enabling an adjustment of the resonance frequency from the outside. At the bottom of the casing 80, a bottom metallization 85 is provided for soldering the casing 80 to the printed circuit board.

FIG. 7d shows a schematic land pattern to be provided on the printed circuit board. The pads 87 are provided for being soldered to the connecting elements 82, and the metallization 88 is provided for being soldered to the bottom metallization 85.

Any other casing may be used that is suitable to be integrated on a printed circuit board In the above embodiments, the electro-optic modulator 1 has been described as a separate component having a casing in which the components are accommodated. As an alternative, the components of the electro-optic modulator 1 such as the crystal 13 and the resonant element 23, may also be mounted directly to the printed circuit board 40 or 100 and covered by an enclosure. Thereby, a separate substrate 20 within the electro-optic modulator 1 is no longer required because the printed circuit board 40 or 100 has the function of the substrate 20. As the casing in the above embodiment, the enclosure may be made of a metal in order to ensure that electromagnetic radiation generated within the package is efficiently shielded.

The electro-optic modulator according to the invention is suitable for being integrated into such an opto-electronic system among others because it fulfills the requirements with regard both to size and electromagnetic compatibility (EMC). With regard to electromagnetic compatibility, it offers shielding of the part itself as well as impedance matching in order to avoid signal back reflections on the printed circuit board.

Among others, the electro-optic modulator according to the invention has the following features:

While standard sized electro-optic modulators have a size of about 40×40×40 mm³, the electro-optic modulator according to the invention has a size which is comparable to the other components of the system. The internal structure of the modulator, i.e. the way in which the single parts are arranged within the casing and connected to each other is very flexible. In principle such an electro-optic modulator can be realized in the form of any standard package used for electronic devices.

All the components required for a fully functional electro-optic modulator, i.e. the electro-optic crystal, the resonant and/or impedance matching circuitry and wiring patterns connecting the individual components are integrated in a compact package that provides an electromagnetic shielding and is comparable in size to other electronic and optoelectronic components integrated on the same printed circuit board.

Due to the use of the bulk crystal having a cross sectional size comparable to a collimated laser beam width which is expected for on-board electro-optical systems instead of using integrated optical waveguides, a sufficiently large optical aperture is ensured. Further, the alignment requirements are considerably reduced compared to fiber optic solutions.

By the use of the resonant element, the modulation efficiency is highly increased. An experimental setup yielded an increase of the efficiency by up to 400. That means that instead of 1 kV, only 2.5 V are required to achieve the same effect. This increase, however, is strongly frequency dependent.

Due to the impedance matching, only a small or no portion of the signal supplied to the signal input is reflected and may affect noise-sensitive components like lasers, micro-controllers, photodetectors which are arranged on the printed circuit board. Thus, a good electromagnetic compatibility can be achieved. Further, by the use of a metallic housing that functions as a Faraday cage, a proper shielding of the interior of the electro-optic modulator towards the outside can be achieved. On the other hand, even if the signal line acts as an antenna, the magnitude of the signal on that line is largely reduced by the resonant enhancement so that an emission from that line is also significantly reduced, thus further improving the electromagnetic compatibility.

The arrangement of the entire electro-optical modulator within casing which is configured to be integrated on a printed circuit board allows an easy handling of the device. Due to the use of the bulk crystal and the optical windows, a complicated fiber connection and adjustment is not required. The casing further makes the device robust and protects its contents from damage.

The electro-optic modulator according to the invention is suitable for a large application spectrum: Depending on the resonant element used, a modulation frequency of up to 20 GHz may be achieved. By the use of a suited material for the crystal, a wide range of wavelengths can be covered. Due to the use of a bulk crystal, an optical power sufficiently high for most applications may be processed.

Of course, the present invention may be applied to a much wider range of applications than to the Quantum technology that has been described as an exemplary application in the introductory portion of the description.

The invention claimed is:

1. A device for modulating a physical property of a light beam in response to an electrical signal, the device comprising:
   at least one light modulating element capable of modulating the physical property of the light beam in response to an electrical signal;
   an enclosure enclosing the at least one light modulating element, wherein the enclosure is configured to be integrated on a printed circuit board; and
   a resonant element having a resonance frequency and being configured to supply a signal having an amplitude greater than an amplitude of the electrical signal for modulating the physical property of the light beam at the resonance frequency to the light modulating element.

2. The device according to claim 1, wherein the enclosure is a casing accommodating the at least one light modulating element.

3. The device according to claim 2, further comprising an insulating substrate, wherein the at least one light modulating element is attached to the insulating substrate, and the insulating substrate together with the at least one light modulating element is accommodated within the casing.

4. The device according to claim 3, wherein the insulating substrate is made from a ceramic material.

5. The device according to claim 2, wherein the casing is a standard through-hole or surface-mount package used in electronics, and/or the casing is a metal casing.

6. The device according to claim 1, wherein the at least one light modulating element is mounted on the printed circuit board, and the enclosure is mounted on the printed circuit board in a way that it encloses the at least one light modulating element.

7. The device according to claim 6, wherein the enclosure is a metal enclosure.

8. The device according to claim 1, wherein the enclosure comprises:
   a light inlet window configured to permit a light beam from the outside to be directed to an input surface of the light modulating element, and a light outlet window configured to permit a light beam leaving an output surface of the light modulating element to pass to the outside.

9. The device according to claim 1, further comprising a signal input for receiving the electrical signal for modulating the physical property of the light beam, wherein an input impedance of the signal input is matched to a characteristic impedance of a signal line formed on the printed circuit board or to a characteristic impedance defined for the frequency range of the electrical signal, preferably 50 Ω, 75 Ω or 600 Ω.

10. The device according to claim 1, wherein the resonant element is enclosed by the enclosure and/or the resonant element acts as an impedance matching element for matching the input impedance of the signal input is to a characteristic impedance of a signal line formed on the printed circuit board or to a characteristic impedance defined for the frequency range of the electric signal.

11. The device according to claim 1, further comprising a wiring pattern formed on the printed circuit board or on the substrate, wherein the resonant element is mounted on the wiring pattern and/or the resonant element is formed by portions of the wiring pattern.

12. The device according to claim 1, wherein the resonance frequency of the resonant element is adjustable.

13. The device according to claim 1, further comprising a travelling wave element configured to supply the electrical signal for modulating the physical property of the light beam to the light modulating element, wherein the travelling wave element is enclosed by the enclosure and/or the travelling wave element acts as an impedance matching element for matching the input impedance of the signal input is to a characteristic impedance of a signal line formed on the printed circuit board or to a characteristic impedance defined for the frequency range of the electric signal.

14. The device according to claim 1, comprising at least one electro-optic modulator, wherein the electro-optic modulator comprises a crystal made of a material exhibiting an electro-optic effect, the crystal being the light modulating element of the device.

15. A printed circuit board, comprising a device for modulating a physical property of a light beam in response to an electrical signal according to claim 1 integrated on it.

16. A method of producing a printed circuit board having a device for modulating a physical property of a light beam in response to an electrical signal integrated on it, comprising:
  providing a printed circuit board,
  providing a device for modulating a physical property of a light beam in response to an electrical signal according to claim 1, and
  integrating the device for modulating the physical property of the light beam on the printed circuit board.

17. The method according to claim 16, wherein the method further comprises integrating further electronic, optoelectronic and/or optical components on the printed circuit board.

18. A method of producing a device for modulating a physical property of a light beam in response to an electrical signal, the method comprising:
  providing at least one light modulating element capable of modulating the physical property of the light beam in response to an electrical signal;
  accommodating the at least one light modulating element within an enclosure, wherein the enclosure is configured to be integrated on a printed circuit board; and
  providing a resonant element having a resonance frequency and being configured to supply a signal having an amplitude greater than an amplitude of the electrical signal for modulating the physical property of the light beam at the resonance frequency to the light modulating element.

19. A device for modulating a physical property of a light beam in response to an electrical signal, the device comprising:
  at least one light modulating element capable of modulating the physical property of the light beam in response to an electrical signal, wherein the light modulating element comprises a bulk crystal formed as a separate single-piece free-space crystal; and
  an enclosure enclosing the at least one light modulating element, wherein the enclosure is configured to be integrated on a printed circuit board.

20. A method of producing a device for modulating a physical property of a light beam in response to an electrical signal, the method comprising:
  providing at least one light modulating element capable of modulating the physical property of the light beam in response to an electrical signal, wherein the light modulating element comprises a bulk crystal formed as a separate single-piece free-space crystal; and
  accommodating the at least one light modulating element within an enclosure, wherein the enclosure is configured to be integrated on a printed circuit board.

* * * * *

UNITED STATES PATENT AND TRADEMARK OFFICE
CERTIFICATE OF CORRECTION

PATENT NO. : 12,265,287 B2
APPLICATION NO. : 17/596318
DATED : April 1, 2025
INVENTOR(S) : Enrico Vogt Page 1 of 1

It is certified that error appears in the above-identified patent and that said Letters Patent is hereby corrected as shown below:

In the Claims

In Column 14, Line 5, in Claim 17, after "optoelectronic" insert -- , --.

Signed and Sealed this
Twenty-fourth Day of June, 2025

Coke Morgan Stewart
*Acting Director of the United States Patent and Trademark Office*